(12) United States Patent
Kong et al.

(10) Patent No.: US 9,299,580 B2
(45) Date of Patent: Mar. 29, 2016

(54) HIGH ASPECT RATIO PLASMA ETCH FOR 3D NAND SEMICONDUCTOR APPLICATIONS

(71) Applicant: Applied Materials, Inc., Santa Clara, CA (US)

(72) Inventors: Byungkook Kong, San Ramon, CA (US); Gene Lee, San Jose, CA (US); Liming Yang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/462,817

(22) Filed: Aug. 19, 2014

(65) Prior Publication Data

US 2016/0056050 A1     Feb. 25, 2016

(51) Int. Cl.
  *H01L 21/20*   (2006.01)
  *H01L 21/311*  (2006.01)
  *H01L 27/115*  (2006.01)

(52) U.S. Cl.
  CPC .... *H01L 21/31116* (2013.01); *H01L 27/11556* (2013.01); *H01L 27/11582* (2013.01)

(58) Field of Classification Search
  None
  See application file for complete search history.

(56) References Cited

U.S. PATENT DOCUMENTS

| | | | |
|---|---|---|---|
| 7,786,020 B1 | 8/2010 | Kang et al. | |
| 2010/0048003 A1 | 2/2010 | Sung et al. | |
| 2011/0031216 A1* | 2/2011 | Liao et al. | 216/67 |
| 2011/0159442 A1 | 6/2011 | Ken et al. | |
| 2011/0244666 A1 | 10/2011 | Kim et al. | |
| 2013/0020611 A1 | 1/2013 | Gumaelius | |
| 2013/0062735 A1 | 3/2013 | Fu et al. | |
| 2013/0083589 A1 | 4/2013 | Or-Bach et al. | |
| 2013/0105443 A1* | 5/2013 | Banna et al. | 216/67 |

* cited by examiner

*Primary Examiner* — Angel Roman
(74) *Attorney, Agent, or Firm* — Patterson & Sheridan, LLP

(57) ABSTRACT

Embodiments of the present disclosure provide methods for forming features in a film stack that may be utilized to form stair-like structures with accurate profiles control in manufacturing three dimensional (3D) stacking of semiconductor chips. In one example, a method of etching a material layer disposed on a substrate using synchronized RF pulses includes providing an etching gas mixture into a processing chamber having a film stack disposed on a substrate, synchronously pulsing a RF source power and a RF bias power into the etching gas mixture at a ratio of less than 0.5, and etching the film stack disposed on the substrate.

20 Claims, 4 Drawing Sheets

HIGH ASPECT RATIO PLASMA ETCH FOR 3D NAND SEMICONDUCTOR APPLICATIONS

BACKGROUND

1. Field

Embodiments of the present invention generally relate to methods of forming high aspect ratio features in a vertical type semiconductor device, and more particularly to methods of forming high aspect ratio features in a vertical type semiconductor device with stair-like structures for semiconductor applications.

2. Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

A patterned mask, such as a photoresist layer, is commonly used in forming structures, such as gate structure, shallow trench isolation (STI), bite lines and the like, on a substrate by etch process. The patterned mask is conventionally fabricated by using a lithographic process to optically transfer a pattern having the desired critical dimensions to a layer of photoresist. The photoresist layer is then developed to remove undesired portion of the photoresist, thereby creating openings in the remaining photoresist.

In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, stair-like structures are often utilized to allow multiple interconnection structures to be disposed thereon, forming high-density of vertical transistor devices.

When forming features, such as trenches or vias, in stair-like structures in a film stack disposed on a substrate, an etch process using a photoresist layer as an etching mask is often utilized. The film stack comprises multiple material layers in which the features, such as trenches or vias, are formed with high aspect ratios. High aspect ratio is generally defined as the ratio between the depth of the feature and the width of the feature, for at least about 20:1 and greater. In an exemplary embodiment depicted in FIG. 1A, a photoresist layer (not shown) may serve as an etching mask layer to transfer structures onto a film stack 100 disposed on a substrate 104 to form stair-like structures 110 on the substrate 104. The film stack 100 typically includes alternating layers of layers 102a, 102b (shown as $102a_1$, $102b_1$, $102a_2$, $102b_2$, . . . , $102n_1$, $102n_2$), either conductive layers or insulating layers. During etching, features 130 with high aspect ratio, such as greater than 20:1, may be formed into the film stack 100.

During etching of features 130, 132, 134 into the film stack 100 on the substrate 104, redeposition or build-up of by-products or other materials generated during the etch process may accumulate and/or attack on the top and/or sidewalls of the features 130, 132, 134 being etched, thereby blocking the opening the feature 130, 132, 134 being formed in the film stack 100. For example, the redeposition or build-up of by-products during etch process may result in early close-up of the feature, such as one of the exemplary features 132 depicted in FIG. 1A, thus preventing etching through the entire film stack 100 to expose the substrate 104. As the opening of the etched features 132 are narrowed and/or sealed by the accumulated redeposition material, the reactive etchants are prevented from reaching the lower surface 133 of the features 132, thereby limiting the aspect ratio that may be obtained. The feature 130 formed in the film stack 100 represents a good example in which a desired profile and dimension formed in the feature 130 has been obtained, e.g., with the features 130 formed through the film stack 100 reach a desired depth in the substrate 104 without significant top surface or features sidewall loss.

Furthermore, irregular profiles and growth of the etching by-products formed during etching may gradually block the small openings used to fabricate the small critical dimension structures, thereby resulting in bowed, distorted, toppled, or twisted profiles of the etched structures. FIG. 1B depicts an example of a magnified view of a defective feature 134 circled in FIG. 1A. Redeposition material 138 or build-up of etching by-products may be randomly and/or irregularly adhere to the top surface 139 and/or sidewalls 140 of the film stack 100, the resulting irregular profile and growth of the redeposition material 138 or etching by-products may alter the flow path of the reactive etchants, resulting in a bowing or twisting profile 142 of the features 134 formed in the film stack 100. As the film stack 100 formed on the substrate 104 often includes one or more different materials, such as materials 102a and 102b, poor profile control or edge line discontinuity at the interface of different materials may result in incompatible stress between each film. As the geometry and the aspect ratio of the structures become even smaller and higher, the stress mismatch issue occurred between different materials in the film stack become increasingly dominant, thereby resulting in stress induced line edge roughness or line breakage, eventually resulting in device failure.

Thus, there is a need for improved methods and apparatus for forming high aspect ratio features, such as forming features in stair-like structures, with accurate profiles and dimension control for three dimensional (3D) stacking of semiconductor chips.

SUMMARY

Embodiments of the present disclosure provide an apparatus and methods for forming high aspect features in a film stack, which may be utilized to form stair-like structures, with accurate profiles and dimension control for manufacturing three dimensional (3D) stacked semiconductor chips. In one example, a method of etching a material layer disposed on a substrate using synchronized RF pulses includes providing an etching gas mixture into a processing chamber having a film stack disposed on a substrate, synchronously pulsing a RF source power and a RF bias power into the etching gas mixture at a ratio of less than 0.5, and etching the film stack disposed on the substrate.

In another example, a method of etching a film stack disposed on a substrate using synchronized RF pulses includes providing an etching gas mixture into a processing chamber having a film stack disposed on a substrate, wherein the film stack includes repeated pairs of layers, synchronously pulsing a RF source power at a frequency greater than 2.5 MHz and a RF bias power at a frequency less than 2.5 MHz into the etching gas mixture at a ratio of less than 0.5, and etching the film stack disposed on the substrate.

In yet another example, a method of etching a film stack disposed on a substrate using synchronized RF pulses, the film stack utilized to form a stair-like structures on the substrate includes providing an etching gas mixture including a fluorine-carbon containing and a halogen containing gas into a processing chamber having a film stack disposed on a substrate, wherein the film stack includes repeated pairs of layers, synchronously pulsing a RF source power at a frequency greater than 2.5 MHz and a RF bias power at a frequency less than 2.5 MHz into the etching gas mixture at a ratio of less than 0.5, and etching the film stack disposed on the substrate to form features with aspect ratio greater than 20:1.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for forming features in a film stack which may be utilized to form stair-like structures on a substrate for three dimensional (3D) stacking of semiconductor chips. In one example, precise dimension control, accurate feature transfer and good process control during etching may be obtained through synchronizing pulses of a RF source power and a RC bias power at a predetermined ratio. By utilizing synchronized pulses of the RF source power and the RC bias power during an etch process, the trajectory of reactive species generated in the plasma may be extended, thus pulling reactive species down to a bottom of the film stack, so as to successfully form features with high aspect ratios in the film stack.

Figure 1A:
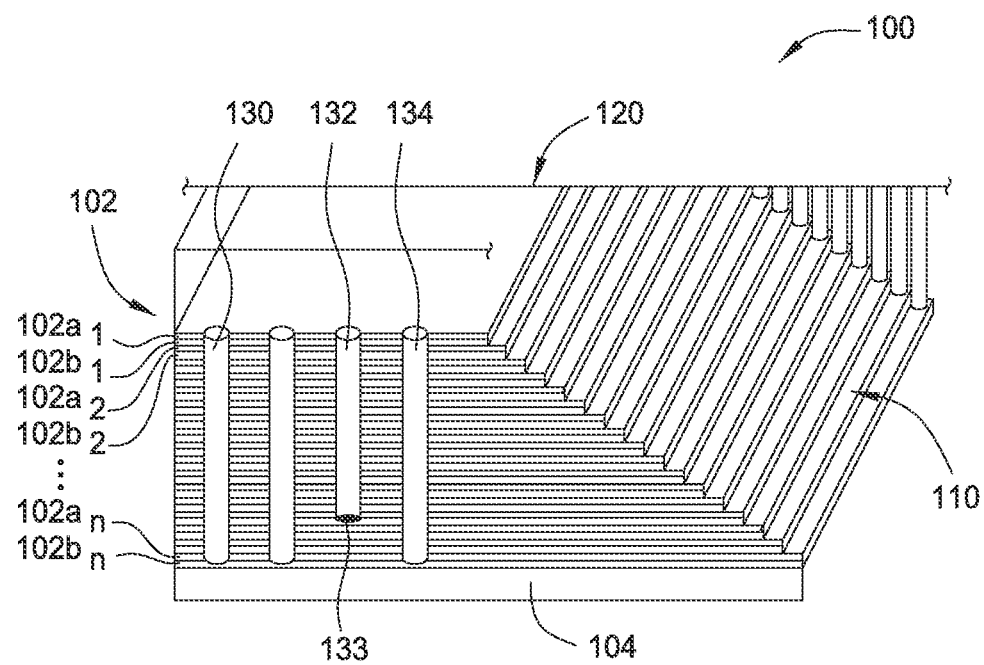
FIG. 1A depicts a schematic cross-sectional view of conventional features formed in a film stack disposed on a substrate.
Figure 1B:
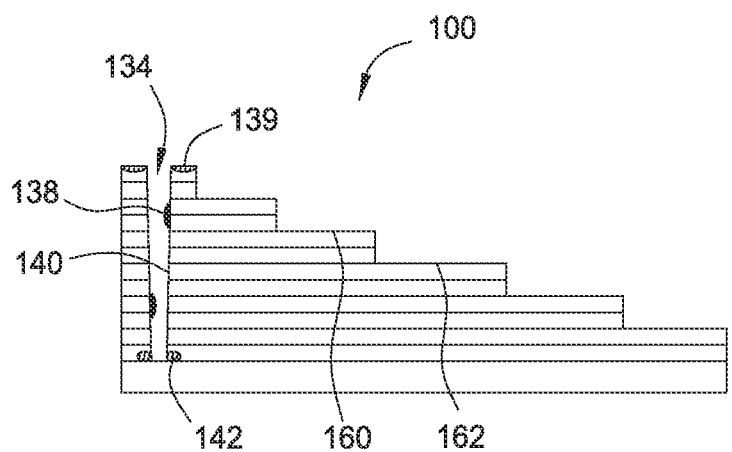
FIG. 1B depicts a portion of a schematic cross-sectional view of the conventional features formed in the film stack of FIG. 1A.
Figure 2:
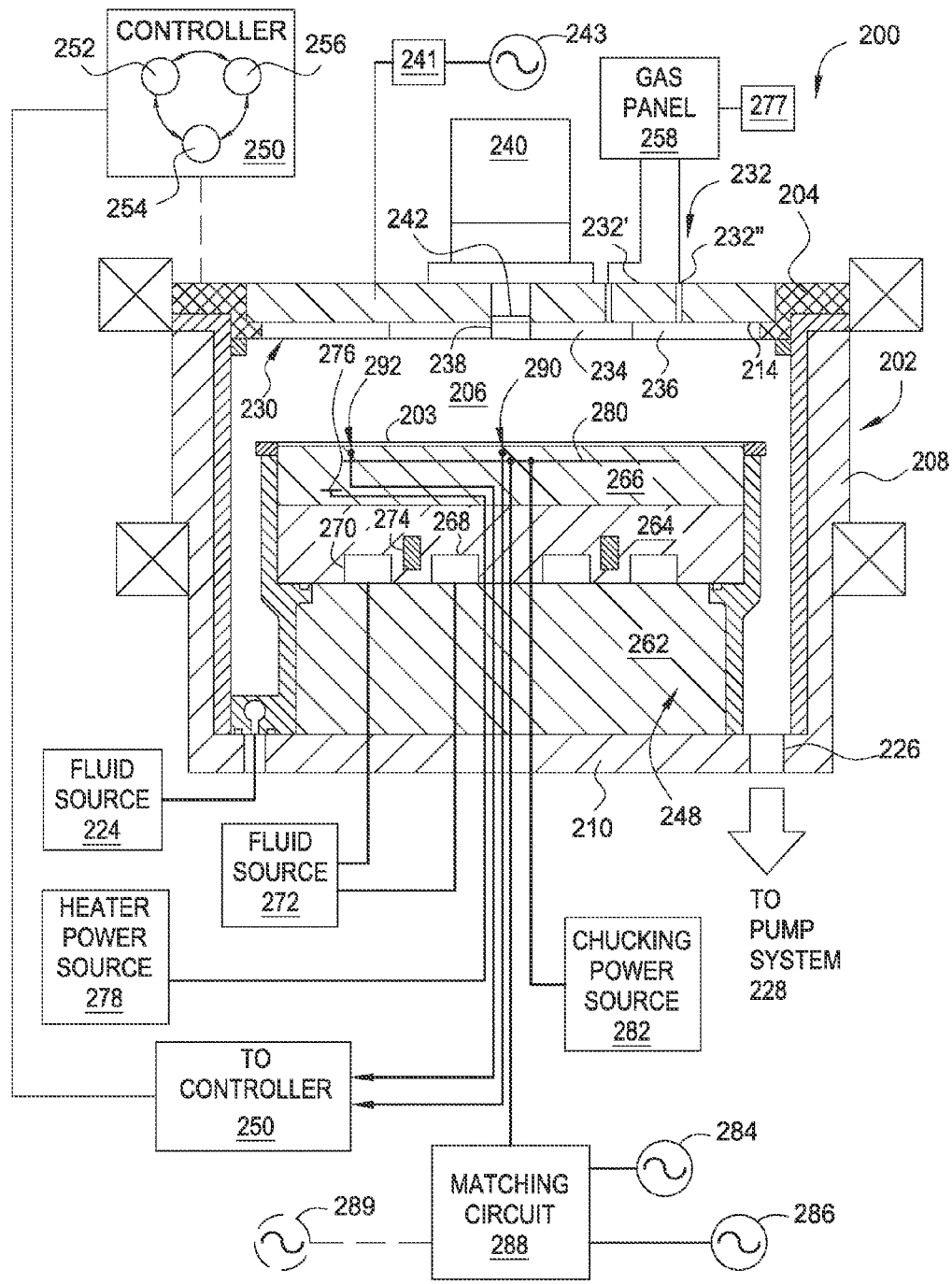
FIG. 2 depicts an apparatus utilized to form features in a film sack on a substrate in accordance with one embodiment of the present invention.

FIG. 2 is a sectional view of one example of a processing chamber 200 suitable for performing an etch process to form features in a film stack with high aspect ratio, such as greater than 20:1. Suitable processing chambers that may be adapted for use with the teachings disclosed herein include, for example, ENABLER® and C3® processing chambers available from Applied Materials, Inc. of Santa Clara, Calif. Although the processing chamber 200 is shown including a plurality of features that enable superior etching performance, it is contemplated that other processing chambers, including those from other manufacturers, may be adapted to benefit from one or more of the inventive features disclosed herein.

The processing chamber 200 includes a chamber body 202 and a lid 204 which enclose an interior volume 206. The chamber body 202 is typically fabricated from aluminum, stainless steel or other suitable material. The chamber body 202 generally includes sidewalls 208 and a bottom 210. A substrate access port (not shown) is generally defined in a sidewall 208 and a selectively sealed by a slit valve to facilitate entry and egress of a substrate 100 from the processing chamber 200. An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 200. In one implementation, the pump system 228 maintains the pressure inside the interior volume 206 at operating pressures typically between about 0.1 mTorr to about 500 Torr.

The lid 204 is sealingly supported on the sidewall 208 of the chamber body 202. The lid 204 may be opened to allow excess to the interior volume 106 of the processing chamber 200. The lid 204 includes a window 242 that facilitates optical process monitoring. In one implementation, the window 242 is comprised of quartz or other suitable material that is transmissive to a signal utilized by an optical monitoring system 240 mounted outside the processing chamber 200.

The optical monitoring system 240 is positioned to view at least one of the interior volume 206 of the chamber body 202 and/or the substrate 100 positioned on a substrate support pedestal assembly 248 through the window 242. In one embodiment, the optical monitoring system 240 is coupled to the lid 204 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 258 is coupled to the processing chamber 200 to provide process and/or cleaning gases to the interior volume 206. In the example depicted in FIG. 2, inlet ports 232', 232" are provided in the lid 204 to allow gases to be delivered from the gas panel 258 to the interior volume 206 of the processing chamber 200. In one implementation, the gas panel 258 is adapted to provide fluorinated process gas through the inlet ports 232', 232" and into the interior volume 206 of the processing chamber 200. In one implementation, the process gas provided from the gas panel 258 includes at least a fluorinated gas, chlorine, and a carbon containing gas, an oxygen gas, a nitrogen containing gas and a chlorine containing gas. Examples of fluorine-carbon containing gas gases include $CF_4$, $C_2F_6$, $C_3F_6$, $C_4F_6$, $C_4F_8$, $C_5F_{10}$, $C_6F_8$.

Other fluorinated gases may include one or more of $C_2F$, $C_4F_6$, $C_3F_8$ and $C_5F_8$. Examples of the oxygen containing gas include $O_2$, $CO_2$, CO, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include HCl, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 230 is coupled to an interior surface 214 of the lid 204. The showerhead assembly 230 includes a plurality of apertures that allow the gases flowing through the showerhead assembly 230 from the inlet ports 232', 232" into the interior volume 206 of the processing chamber 200 in a predefined distribution across the surface of the substrate 100 being processed in the processing chamber 200.

A remote plasma source 277 may be optionally coupled to the gas panel 258 to facilitate dissociating the gas mixture to form a remote plasma prior to entering into the interior volume 206 for processing. A RF source power 243 is coupled through a matching network 241 to the showerhead assembly 230. The RF source power 243 typically is capable of producing up to about 3000 W at a tunable frequency in a range from about 50 kHz to about 200 MHz.

The showerhead assembly 230 additionally includes a region transmissive to an optical metrology signal. The optically transmissive region or passage 238 is suitable for allowing the optical monitoring system 240 to view the interior volume 206 and/or the substrate 100 positioned on the substrate support pedestal assembly 248. The passage 238 may be a material, an aperture or plurality of apertures formed or disposed in the showerhead assembly 230 that is substantially transmissive to the wavelengths of energy generated by, and reflected back to, the optical monitoring system 240. In one embodiment, the passage 238 includes a window 242 to prevent gas leakage through the passage 238. The window 242 may be a sapphire plate, quartz plate or other suitable material. The window 242 may alternatively be disposed in the lid 204.

In one implementation, the showerhead assembly 230 is configured with a plurality of zones that allow for separate control of gas flowing into the interior volume 206 of the processing chamber 200. In the example illustrated in FIG. 2, the showerhead assembly 230 as an inner zone 234 and an outer zone 236 that are separately coupled to the gas panel 258 through separate inlet ports 232', 232".

The substrate support pedestal assembly 248 is disposed in the interior volume 206 of the processing chamber 200 below the gas distribution (showerhead) assembly 230. The substrate support pedestal assembly 248 holds the substrate 100 during processing. The substrate support pedestal assembly 248 generally includes a plurality of lift pins (not shown) disposed therethrough that are configured to lift the substrate 100 from the substrate support pedestal assembly 248 and facilitate exchange of the substrate 100 with a robot (not shown) in a conventional manner. An inner liner 218 may closely circumscribe the periphery of the substrate support pedestal assembly 248.

In one implementation, the substrate support pedestal assembly 248 includes a mounting plate 262, a base 264 and an electrostatic chuck 266. The mounting plate 262 is coupled to the bottom 210 of the chamber body 202 includes passages for routing utilities, such as fluids, power lines and sensor leads, among others, to the base 264 and the electrostatic chuck 166. The electrostatic chuck 266 comprises at least one clamping electrode 280 for retaining the substrate 100 below showerhead assembly 230. The electrostatic chuck 266 is driven by a chucking power source 282 to develop an electrostatic force that holds the substrate 100 to the chuck surface, as is conventionally known. Alternatively, the substrate 100 may be retained to the substrate support pedestal assembly 248 by clamping, vacuum or gravity.

At least one of the base 264 or electrostatic chuck 266 may include at least one optional embedded heater 276, at least one optional embedded isolator 274 and a plurality of conduits 268, 270 to control the lateral temperature profile of the substrate support pedestal assembly 248. The conduits 268, 270 are fluidly coupled to a fluid source 272 that circulates a temperature regulating fluid therethrough. The heater 276 is regulated by a power source 278. The conduits 268, 270 and heater 276 are utilized to control the temperature of the base 264, thereby heating and/or cooling the electrostatic chuck 266 and ultimately, the temperature profile of the substrate 100 disposed thereon. The temperature of the electrostatic chuck 266 and the base 264 may be monitored using a plurality of temperature sensors 290, 292. The electrostatic chuck 266 may further comprise a plurality of gas passages (not shown), such as grooves, that are formed in a substrate support pedestal supporting surface of the chuck 266 and fluidly coupled to a source of a heat transfer (or backside) gas, such as He. In operation, the backside gas is provided at controlled pressure into the gas passages to enhance the heat transfer between the electrostatic chuck 266 and the substrate 100.

In one implementation, the substrate support pedestal assembly 248 is configured as a cathode and includes an electrode 280 that is coupled to a plurality of RF power bias sources 284, 286. The RF bias power sources 284, 286 are coupled between the electrode 280 disposed in the substrate support pedestal assembly 248 and another electrode, such as the showerhead assembly 230 or ceiling (lid 204) of the chamber body 202. The RF bias power excites and sustains a plasma discharge formed from the gases disposed in the processing region of the chamber body 202.

In the example depicted in FIG. 2, the dual RF bias power sources 284, 286 are coupled to the electrode 280 disposed in the substrate support pedestal assembly 248 through a matching circuit 288. The signal generated by the RF bias power sources 284, 286 is delivered through matching circuit 188 to the substrate support pedestal assembly 248 through a single feed to ionize the gas mixture provided in the plasma processing chamber 200, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts. An additional bias power source 289 may be coupled to the electrode 280 to control the characteristics of the plasma.

In one mode of operation, the substrate 100 is disposed on the substrate support pedestal assembly 248 in the plasma processing chamber 200. A process gas and/or gas mixture is introduced into the chamber body 202 through the showerhead assembly 230 from the gas panel 258. A vacuum pump system 228 maintains the pressure inside the chamber body 202 while removing deposition by-products.

A controller 250 is coupled to the processing chamber 200 to control operation of the processing chamber 200. The controller 250 includes a central processing unit (CPU) 252, a memory 254, and a support circuit 256 utilized to control the process sequence and regulate the gas flows from the gas panel 258. The CPU 252 may be any form of general purpose computer processor that may be used in an industrial setting. The software routines can be stored in the memory 254, such as random access memory, read only memory, floppy, or hard disk drive, or other form of digital storage. The support circuit 256 is conventionally coupled to the CPU 252 and may include cache, clock circuits, input/output systems, power supplies, and the like. Bi-directional communications between the controller 250 and the various components of the processing chamber 200 are handled through numerous signal cables.

Figure 3:
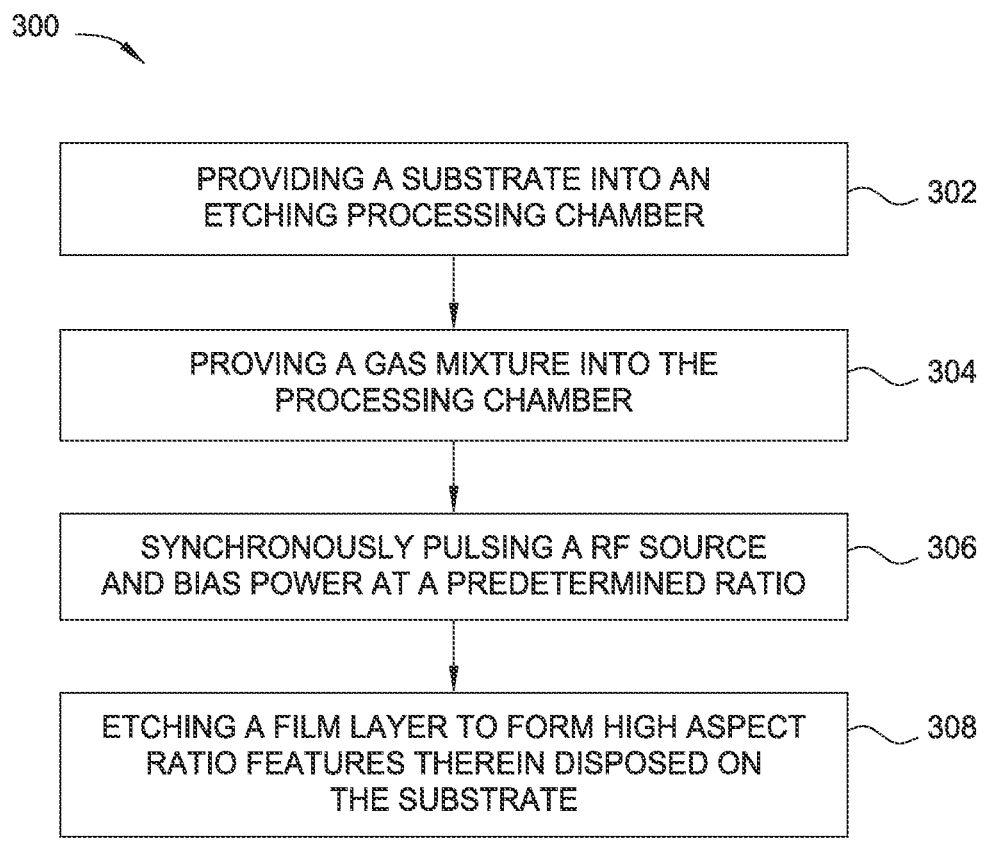
FIG. 3 depicts a flow diagram of a method for forming features in a film stack formed on a substrate in accordance with one embodiment of the present invention.
Figure 4A:
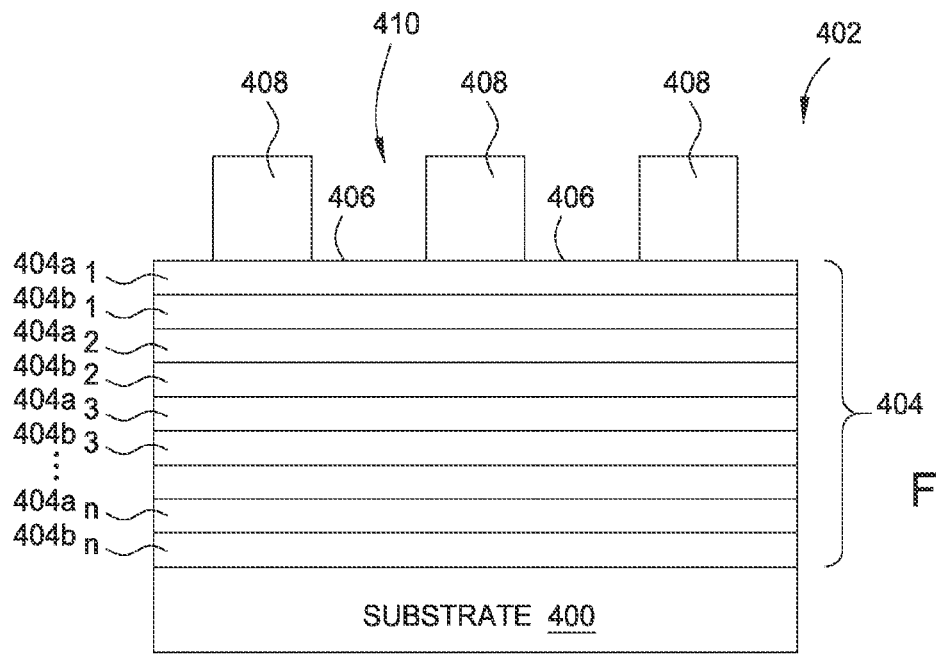
FIGS. 4A-4B depict one embodiment of a sequence for manufacturing stair-like structures formed on a substrate in accordance with the embodiment depicted in FIG. 3.
Figure 4B:
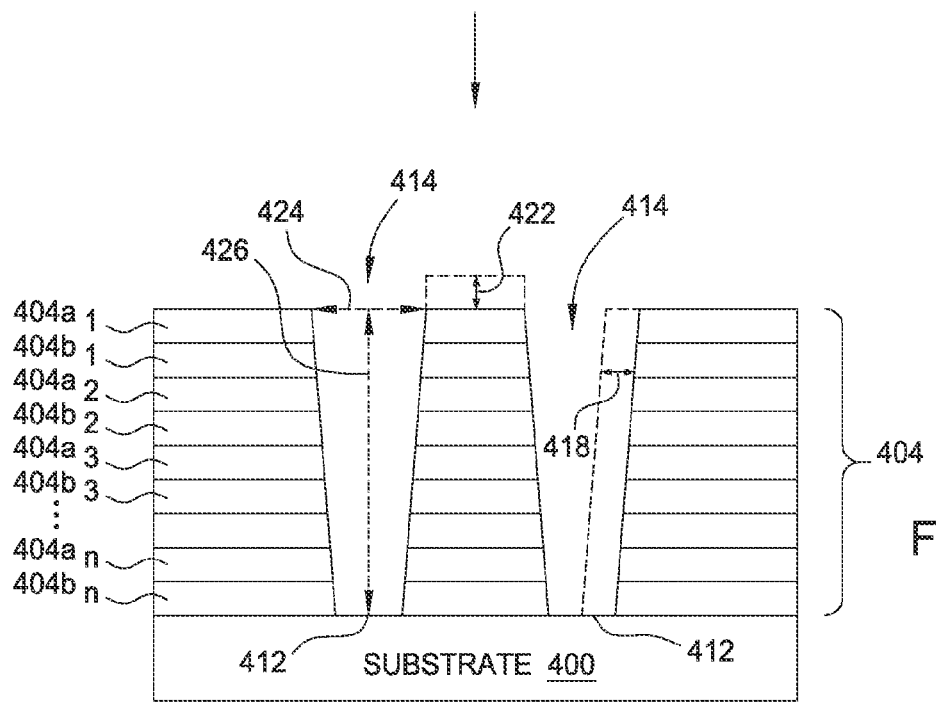

FIG. 3 is a flow diagram of one embodiment of a method 300 for forming features in a film stack that may be utilized to form features on a substrate. The method 300 may be performed in a processing chamber, such as the processing chamber 200 depicted in FIG. 2 or other suitable processing chambers. FIGS. 4A-4B are schematic cross-sectional views illustrating a sequence for forming features in a film stack disposed on a substrate according to the method 300. The method 300 may be utilized to form high aspect ratio features, e.g., greater than 20:1, for semiconductor devices, particularly for three dimensional (3D) stacking of semiconductor memory. Alternatively, the method 300 may be beneficially utilized to etch and form other types of structures. Although the method 300 is described below with reference to a substrate utilized to manufacture features in a film stack that may be utilized to form stair-like structures for three dimensional semiconductor chips, the method 300 may also be used to advantage in other applications for manufacturing other types of devices.

The method 300, which may be stored in computer readable form in the memory 254 of the controller 250, begins at block 302 by transferring a substrate, such as a substrate 400 depicted in FIG. 4A, onto the substrate support pedestal assembly 248 disposed in a processing chamber, such as the processing chamber 200 depicted in FIG. 2. The substrate 400 may be a silicon based material or any suitable insulating materials or conductive materials as needed, having a film stack 402 disposed on the substrate 400 that may be utilized to form desired stair-like structures in the film stack 402.

As shown in the exemplary example depicted in FIG. 4A, the substrate 400 may have a substantially planar surface, an uneven surface, or a substantially planar surface having a structure formed thereon. The film stack 402 is formed on the substrate 400. In one embodiment, the film stack 402 may be utilized to form a gate structure, a contact structure or an interconnection structure in the front end or back end processes. The method 300 may be performed to form features in the film stack 402 that may be utilized to form stair-like structures therein. In one embodiment, the substrate 400 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 400 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, a 450 mm diameter substrate. In the embodiment wherein a SOI structure is utilized for the substrate 400, the substrate 400 may include a buried dielectric layer disposed on a silicon crystalline substrate. In the example depicted herein, the substrate 400 may be a crystalline silicon substrate.

In one implementation, the film stack 402 disposed on the substrate 400 may have a multi-material layer 404 that has a number of vertically stacked layers. The multi-material layer 404 may comprise pairs including a first layer (shown as $404a_1, 404a_2, \ldots, 404a_n$) and a second layer (shown as $404b_1, 404b_2, \ldots, 404b_n$) repeatedly formed in the multi-material layer 404. The pairs includes alternating first layer (shown as $404a_1, 404a_2, \ldots, 404a_n$) and second layer (shown as $404b_1, 404b_2, \ldots, 404b_n$) repeatedly formed until desired numbers of pairs of the first layers and the second layers are reached.

The multi-material layer 404 formed in the film stack 402 may be a part of a semiconductor chip, such as a three-dimensional (3D) memory chip. Although three repeating layers of first layers (shown as $404a_1, 404a_2, \ldots, 404a_n$) and second layers (shown as $404b_1, 404b_2, \ldots, 404b_n$) are shown in FIGS. 4A-4B, it is noted that any desired number of repeating pairs comprised of first and the second layers may be utilized as needed.

In one embodiment, the multi-material layers 404 may be utilized to form multiple gate structures for a three-dimensional (3D) memory chip. The first layers $404a_1, 404a_2, \ldots, 404a_n$, formed in the multi-material layer 404 may be a first dielectric layer and the second layers $404b_1, 404b_2, \ldots, 404b_n$ may be a second dielectric layer. Suitable dielectric layers may be utilized to form the first layers $404a_1, 404a_2, \ldots, 404a_n$ and the second layers $404b_1, 404b_2, \ldots, 404b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In some embodiments, the dielectric layers may be a high-k material having a dielectric constant greater than 4. Suitable examples of the high-k materials include hafnium dioxide ($HfO_2$), zirconium dioxide ($ZrO_2$), hafnium silicon oxide ($HfSiO_2$), hafnium aluminum oxide (HfAlO), zirconium silicon oxide (ZrSiO2), tantalum dioxide ($TaO_2$), aluminum oxide, aluminum doped hafnium dioxide, bismuth strontium titanium (BST), and platinum zirconium titanium (PZT), among others.

In some examples, the first layers $404a_1, 404a_2, \ldots, 404a_n$ and the second layers $404b_1, 404b_2, \ldots, 404b_n$ may be a conductive layer selected from a group consisting of polysilicon, doped silicon, such as n-type or p-type doped silicon, other suitable silicon containing material, tungsten (W), tungsten silicide (WSi), tungsten polysilicon (W/poly), tungsten alloy, tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, nitride compound thereof, such as titanium nitride (TiN) and tantalum nitride (TaN), and combinations thereof, among others.

In one particular example, the first layers $404a_1, 404a_2, \ldots, 404a_n$ are silicon oxide layers and the second layers $404b_1, 404b_2, \ldots, 404b_n$ are silicon nitride layers or polysilicon layers disposed on the first layers $404a_1, 404a_2, \ldots, 404a_n$. In one embodiment, the thickness of first layers $404a_1, 404a_2, \ldots, 404a_n$ may be controlled at between about 50 Å and about 1000 Å, such as about 500 Å, and the thickness of the each second layers $404b_1, 404b_2, \ldots, 404b_n$ may be controlled at between about 50 Å and about 1000 Å, such as about 500 Å. The multi-material layers 404 may have a total thickness between about 100 Å and about 2000 Å.

A patterned photoresist layer 408, a lithographically patterned mask, is then formed over the multi-material layer 404 exposing portions 406 of the first layers $404a_1$ for etching, as shown in FIG. 4A. In one embodiment, the photoresist layer 408 may is a positive tone photoresist, a negative tone photoresist, a UV lithography photoresist, an i-line photoresist, an e-beam resist (for example, a chemically amplified resist (CAR)) or other suitable photoresist. In one embodiment, the photoresist layer 408 may include organic polymer materials, such as fluoropolymers, silicon-containing polymers, hydroxy styrene, or acrylic acid monomers to provide acid groups when the photoresist layer 408 is exposed to radiation. The choice of the material for the photoresist layer 408 depends on the particular microelectronic device processing application being performed. In particular, the choice of the material for the photoresist layer 408 depends on the properties of the photoresist layer 408 at a given wavelength of radiation. In alternate embodiments, the photoresist layer 408 is optimized to a wavelength of radiation, e.g., 365 nm, 248 nm, 193 nm, 157 nm, and 13 nm.

At block 304, an etching gas mixture is supplied into the processing chamber 200 to etch the portions 406 of the first layers $404a_1$ exposed by the patterned photoresist layer 408, as shown in FIG. 4B, until a predetermined depth 426 of a feature 414 is formed in the multi-material layer 404. The patterned photoresist layer 408 servers as an etching mask during the etch process of the multi-material layer 404. The etching gas mixture is continuously supplied to etch the multi-material layer 404 until the depth 426 of the feature 414 are formed in the multi-material layer 404. In one example, the depth 426 is the same as the thickness of the whole multi-material layer 404, e.g., the multi-material layer 404 is substantially etched through without early close-up or incomplete etching. In one embodiment, the depth 426 may be between about 1 µm and about 4 µm.

In one embodiment, the etching gas mixture selected to etch the multi-material layer 404 includes at least a fluorine-carbon containing gas having a formula $C_xF_y$, wherein x and y are integers ranging from 1 to 8 and 8 to 34 respectively. Suitable examples of the fluorine-carbon containing gas include $CF_4$, $C_2F_6$, $C_3F_6$, $C_4F_6$, $C_4F_8$, $C_5F_{10}$, $C_6F_8$, and the like. In a particular embodiment, the fluorine-carbon containing gas as suggested in the etching gas mixture includes $C_4F_6$ or $C_4F_8$ and $CF_4$.

It is believed that a fluorine-carbon containing gas with high carbon content, such as wherein a molecule of the fluorine-carbon containing gas has greater than 3 carbon atoms (i.e., $C_4F_6$ or $C_4F_8$ in this example), may efficiently minimize top area electron charging as well as passivate top and sidewall areas of the features 414 during etching, thus maintaining a minimum top loss 422 and sidewall loss/damage 418 during the etch process. In one example, the top loss 422 during the etch process may be maintained less than 200 Å and the sidewall loss 418 during the etch process may be maintained less than 50 Å.

Furthermore, a halogen containing gas, such as $NF_3$, $SF_6$, $Cl_2$, $Br_2$, HCl, and the like, may also be supplied into the etching gas mixture to assist removing etching by-product that may possibly block the features 414 formed in the multi-material layer 404 during etching. In one particularly embodiment, $NF_3$ is supplied in the etching gas mixture to facilitate removing etching by-products out of the processing chamber.

While supplying the etching gas mixture, an oxygen containing gas may also be supplied during the etch process. It is believed that the oxygen gas may contribute to avoid early etching-stop due to overly accumulation of polymer byproduct deposits. Suitable examples of the oxygen containing gas may be supplied in the etching gas mixture include $O_2$, $NO_2$, $N_2O$, CO, $CO_2$, $H_2O_2$, $O_3$, and the like. An inert gas may also be supplied into the etching gas mixture to assist the profile control as needed. Examples of the inert gas supplied in the gas mixture include Ar, He, Ne, Kr, Xe or the like. In one particular example, the etching gas mixture includes $CF_4$, $C_4F_6$ or $C_4F_8$, $NF_3$ and $O_2$.

In one embodiment, the fluorine-carbon containing gas supplied in the etching gas mixture, such as $C_4F_6$ or $C_4F_8$, may be maintained at a flow rate by volume between about 5 sccm and about 100 sccm. $CF_4$ gas may be maintained at a flow rate by volume between about 10 sccm and about 200 sccm. The halogen containing gas supplied in the etching gas mixture may be maintained at a flow rate by volume between about 2 sccm and about 60 sccm. The oxygen containing gas supplied in the etching gas mixture may be maintained at a flow rate by volume between about 5 sccm and about 100 sccm. The optional inert gas may be supplied to the processing chamber at a flow rate by volume between about 0 sccm and about 600 sccm.

At block 306, while supplying the etching gas mixture into the processing chamber, RF power may be then applied in the etching gas mixture to form a plasma. In one embodiment, the RF power applied in the etching gas mixture may include providing RF source power at a high frequency, such as greater than 2.5 MHz, and a RF bias power at a low frequency, such as less than 2.5 MHz. During processing, the processing gases in the etching gas mixture may be dissociated as reactive etchants by the plasma formed from the etching gas mixture. The fluorine ions dissociated from fluorine-carbon containing gas and the halogen containing gas in the etching gas mixture react with and attack the multi-material layer 404 through the opening 410 defined by the photoresist layer 408. In one example, in order to maintain the profile and proper critical dimension of the feature 414 formed in the multi-material layer 404, the fluorine-carbon containing gas supplied in the etching gas mixture is capable of generating polymer-type carbon containing gas so as to form polymer passivation on sidewall and exposed surface of the multi-material layer 404 to protect the top surface of multi-material layer 404 and sidewalls of the features 414 formed in the multi-material layer 404 from being overly etched and attacked during the early stages of the etch process.

In one embodiment, the RF source power coupled to the etching gas mixture has a frequency greater than 2.5 MHz, such as about 13 MHz while a RF bias power may have a frequency less than 2.5 MHz, such as about 2 MHz. It is believed that the RF source power may assist dissociating the processing gas from the etching gas mixture into reactive species while the RF bias power may assist providing directionality to the plasma generated during the etch process.

In one example, the RF source power supplied at the high frequency may be synchronized pulsed with the RF bias power supplied at the low frequency. Synchronized application of the RF source power and RF bias power applied to the processing chamber assists dissociating gases in the etching gas mixture so as to form ions with specific directionality. Thus, an anisotropic etch process is performed to form the feature 414 with desired vertical profile. The energy level generated from the RF source power and the RF bias power may be provided at a predetermined ratio so as to improve feature verticality and enhances accuracy of mask to feature CD transfer between the photoresist layer 408 and the multi-material layer 404. In one embodiment, the feature 414 may have a critical dimension (i.e., width) 424 less than 60 nm with an aspect ratio greater than 30:1. The synchronized application of the RF source power and RF bias power may cyclically and incrementally etch the multi-material layer 404 without over aggressively attacking the multi-material layer 404.

By utilizing synchronization of both the RF source power and the RF bias power with energy levels set to a predetermined ratio, different process performance may be obtained (e.g., dissociating the gas mixture to generate ions with desired directionality and purge undesired etch-product along with ion generation) so as to enable etching features with high aspect ratio and small dimensions with sufficient sidewall protection. In other words, by periodically pulsing RF source and bias power during the etch process, the etch process and a pump/purge process may be obtained to etch the features utilizing etching/by-product removal mechanisms so as to obtain features with desired profiles and dimensions.

In one example, the RF source power and the bias power may be pulsed with a duty cycle between about 20 to about 80 percent at a pulse RF frequency between about 500 Hz and about 10 MHz, with the RF source power having a frequency higher than that of the RF bias power. The RF source power and the RF bias power may be provided to the processing chamber at a synchronous pulse frequency at between about 500 Hz and about 5000 Hz. The RF source power and the RF bias power may be pulsed synchronously, lagged, or alternatively, to maintain a desired processing conditions of the processing chamber. Furthermore, the energy level applied to the RF source power and to the RF bias power may be controlled at a ratio between less than 0.5, such as between 0.5:1 and about 0.01:1. It is believed that with modulating the energy level ratio of the RF source power and to the RF bias power at this particular ratio, such as less than 0.5, high acceleration of the reactive species with specific travelling path may be obtained, thus enhancing directionality of the dissociated ions to penetrate to a bottom 412 of the features 414 during etching, thereby preventing early close-up of the features 414 and elongating the ion trajectory.

During block 306, several process parameters may be controlled during deposition process. The RF source power may be provided to the processing chamber at a frequency greater than 2.5 MHz, such as between about 3 MHz and about 60 MHz while the RF bias power may be provided at a frequency less than 2.5 MHz, such as about 350 kHz or about 2 MHz. The RF source power may be provided between about 200 Watts and about 1000 Watts. The RF bias power may be provided between about 400 Watts and about 2000 Watts. The spacing of the substrate to the gas distribution plate assembly may be controlled in accordance with the substrate dimension. In one embodiment, the spacing is controlled between about 400 mils and about 1200 mils, for example, between about 400 mils and about 850 mils, such as 550 mils. The process pressure may be controlled between about 0.1 mTorr and about 50 mTorr, such as between about 2 mTorr and about 30 mTorr. A substrate temperature is maintained between about −10 degrees Celsius to about 60 degrees Celsius.

At block 308, while supplying the etching gas mixture and application of synchronized of RF source power and bias power, the features 414 with desired dimension and high aspect ratio may be obtained. In one embodiment, the features 414 may have an aspect ratio greater than 20:1, such as about 30:1. The features 414 may have a depth 426 between about 1 μm and about 4 μm and a width 424 between about 40 nm and about 100 nm.

Thus, methods for forming features with high aspect ratio and small critical dimensions may be obtained by utilizing synchronization of RF source and bias power pulses during an etch process. By synchronizing RF bias power and source power pulsed during the etch process while continuously supplying an etching gas mixture, etching reactive species with enhanced directionality may be generated, so as to optimize the etch process while providing sufficient sidewall and top surface protection during the etch process. By doing so, an improved etch process to obtain features with high aspect ratio and small dimension, particularly for applications in three dimensional (3D) stacking of semiconductor chip, is obtained.

While the foregoing is directed to embodiments of the present invention, other and further embodiments of the invention may be devised without departing from the basic scope thereof, and the scope thereof is determined by the claims that follow.

What is claimed is:

1. A method of etching a material layer disposed on a substrate using synchronized RF pulses comprising:
   providing an etching gas mixture into a processing chamber having a film stack disposed on a substrate;
   synchronously pulsing a RF source power and a RF bias power into the etching gas mixture, wherein an energy ratio of the RF source power to the RF bias power is about less than 0.5; and
   etching the film stack disposed on the substrate.

2. The method of claim 1, wherein the film stack includes a multi-material layer made from repeated pairs of layers.

3. The method of claim 2, wherein each repeated pair includes first layer that is a dielectric layer and a second layer that is a dielectric layer or a conductive layer.

4. The method of claim 3, wherein the first layer is a silicon oxide layer and the second layer is a silicon nitride layer.

5. The method of claim 1, wherein the RF source power has a frequency greater than 2.5 MHz and the RF bias power has a frequency less than 2.5 MHz.

6. The method of claim 1, wherein the RF source power has a frequency of about 13 MHz.

7. The method of claim 1, wherein the RF bias power has a frequency of about 2 MHz.

8. The method of claim 1, wherein the RF source power and the RF bias power are synchronously pulsed at a pulsing frequency between about 500 Hz and about 5 kHz.

9. The method of claim 1, wherein the etching gas mixture comprises a fluorine-carbon containing gas.

10. The method of claim 9, wherein a molecule of the fluorine-carbon containing gas has greater than 3 carbon atoms.

11. The method of claim 9, wherein the etching gas mixture further comprises a halogen containing gas and a oxygen containing gas.

12. The method of claim 11, wherein the halogen containing gas is $NF_3$ and the oxygen containing gas is $O_2$.

13. The method of claim 9, wherein the fluorine-carbon containing includes $C_4F_6$, $C_4F_8$ and $CF_4$.

14. The method of claim 1, wherein synchronously pulsing the RF source power and the RF bias power further comprises:
   synchronously pulsing the RF source power and the RF bias power while continuously applying the etching gas mixture into the processing chamber.

15. The method of claim 1, wherein synchronously pulsing the RF source power and the RF bias power further comprises:
   pulsing the RF source power and the RF bias power at a ratio between about 0.5:1 and about 0.01:1.

16. The method of claim 1, wherein providing the etching gas mixture into the processing chamber further comprises:
   maintaining a process pressure at between about 0.1 mTorr and about 50 mTorr.

17. A method of etching a film stack disposed on a substrate using synchronized RF pulses comprising:
   providing an etching gas mixture into a processing chamber having a film stack disposed on a substrate, wherein the film stack includes repeated pairs of layers;

synchronously pulsing a RF source power at a frequency greater than 2.5 MHz and a RF bias power at a frequency less than 2.5 MHz into the etching gas mixture, wherein an energy ratio of the RF source power to the RF bias power is about less than 0.5; and etching the film stack disposed on the substrate.

18. The method of claim 17, wherein the etching gas mixture comprises $CF_4C_4F_6$ or $C_4F_8$.

19. The method of claim 18, wherein the etching gas mixture further comprises $NF_3$ and $O_2$.

20. A method of etching a film stack disposed on a substrate using synchronized RF pulses, the film stack utilized to form a stair-like structures on the substrate comprising:

providing an etching gas mixture including a fluorine-carbon containing and a halogen containing gas into a processing chamber having a film stack disposed on a substrate, wherein the film stack includes repeated pairs of layers;

synchronously pulsing a RF source power at a frequency greater than 2.5 MHz and a RF bias power at a frequency less than 2.5 MHz into the etching gas mixture, wherein an energy ratio of the RF source power to the RF bias power is about less than 0.5; and etching the film stack disposed on the substrate to form features with aspect ratio greater than 20:1.

* * * * *